United States Patent
Farrens et al.

(10) Patent No.: US 6,645,828 B1
(45) Date of Patent: *Nov. 11, 2003

(54) IN SITU PLASMA WAFER BONDING METHOD

(75) Inventors: Sharon N. Farrens, Davis, CA (US); Brian E. Roberds, Santa Clara, CA (US)

(73) Assignee: Silicon Genesis Corporation, San Jose, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 09/658,344

(22) Filed: Sep. 8, 2000

Related U.S. Application Data

(63) Continuation of application No. 09/143,174, filed on Aug. 28, 1998, now Pat. No. 6,180,496.
(60) Provisional application No. 60/057,413, filed on Aug. 29, 1997.

(51) Int. Cl.$^7$ ............................................. H01L 21/30
(52) U.S. Cl. ..................................................... 438/455
(58) Field of Search ................................. 438/455, 456, 438/457, 458, 459, 798, DIG. 974

(56) References Cited

U.S. PATENT DOCUMENTS 6,180,496 B1 * 1/2001 Farrens et al. ............... 438/455
6,194,290 B1 * 2/2001 Kub et al. .................... 438/107
6,423,613 B1 * 7/2002 Geusic ........................ 438/455

* cited by examiner

*Primary Examiner*—Evan Pert
(74) *Attorney, Agent, or Firm*—Townsend and Townsend and Crew LLP

(57) ABSTRACT

A method for chemically bonding semiconductor wafers and other materials to one another without exposing wafers to wet environments, and a bonding chamber for in situ plasma bonding are disclosed. The in situ plasma bonding chamber allows plasma activation and bonding to occur without disruption of the vacuum level. This precludes rinsing of the surfaces after placement in the chamber, but allows for variations in ultimate pressure, plasma gas species, and backfill gases. The resulting bonded materials are free from macroscopic and microscopic voids. The initial bond is much stronger than conventional bonding techniques, thereby allowing for rougher materials to be bonded to one another. These bonded materials can be used for bond and etchback silicon on insulator, high voltage and current devices, radiation resistant devices, micromachined sensors and actuators, and hybrid semiconductor applications. This technique is not limited to semiconductors. Any material with sufficiently smooth surfaces that can withstand the vacuum and plasma environments may be bonded in this fashion.

27 Claims, No Drawings

IN SITU PLASMA WAFER BONDING METHOD

CROSS-REFERENCE TO RELATED APPLICATIONS

This application is a continuation of 09/143,174, filed Aug. 28, 1998, now U.S. Pat. No. 6,180,496, and claims priority from U.S. provisional application serial No. 60/057,413 filed on Aug. 29, 1997.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to semiconductor bonding techniques, and more particularly to a low temperature, insitu, plasma activated wafer bonding apparatus and method.

2. Description of the Background Art

It is well known that direct wafer bonding is an alternative to using organic or inorganic bonding agents for bonding silicon and a number of other semiconductor materials. For example, direct bonding can be facilitated by first activating the surface of the wafer with a base bath ($NH_4OH:H_2O_2:H_2O$, 1:1:5) for silicon and its oxides, or with an acid bath ($HCl:H_2O_2:H_2O$, 1:1:6) or HF dip for nitrides such as AlN and $Si_3N_4$. Plasma exposure is another known technique for activating the surfaces of wafers to be bonded. These surface activation methods render the wafer surfaces hydrophilic and amenable to bonding. After surface activation, the wafers are placed in a spinner where they are rinsed in de-ionized water and spun dry. After this step the wafers are placed surface to surface at which point van der Waals forces pull the two wafers into contact.

The contact bonds which are formed in accordance with conventional wet surface activation are generally weak (less than 0.1 MPa), and not suitable for device processing. This is because the process of oxidation (or corrosion of any kind) upon which high temperature direct bonding of semiconductor materials is based is the result of a two step process: migration of the reacting specie(s) to the reaction site, and then the chemical reaction itself. For example, the high temperature oxidation of silicon (T>700° C.) is known to follow linear kinetics initially until the oxide thickness becomes so thick that the atomic transport is the limiting process. In other words, initially Si and O atoms are directly adjacent or are very close. All that is required is the transfer of electrons between the atoms for the reaction to occur. However, as the oxide thickness increases, oxygen atoms must migrate to the unreacted silicon through the oxide layer.

The energy that must be supplied to the "system" to cause the Si and the oxygen to migrate and react is quite large and, as such, this particular reaction is not self sustaining at low temperatures. Therefore, the bonds are typically strengthened by high temperature anneals (T>900° C.) for silicon and its oxides, and moderate temperature anneals (T~300° C.) for nitrides. Following the anneals the interfacial bond obtains strengths greater than 1-2 MPa up to a maximum of about 4 Mpa (absolute values depending on test method). This strength is sufficient for further processing such as backthinning, polishing, and micromachining, and the interface is generally free from detectable voids. However, the temperatures required for the annealing step have limited the use of conventional direct bonding techniques to applications wherein the materials to be bonded can withstand the high temperature anneal. Unfortunately, the elevated temperature exposure can have a detrimental effect on implanted or diffused etchstop layers via diffusive broadening.

Therefore, while it is known that wafers can be direct bonded, conventional bonding methods are only effective with high temperature anneals and, further, some materials are unable to withstand such high temperatures. Accordingly, high temperature bonding is limited in its application.

To avoid material damage and problems with thermal mismatching in bonding dissimilar materials, there exists a need for a direct bonding process whereby direct bonding can be effected using a low temperature anneal. In addition, to prevent absorption of water and other contaminates present in air, there exists a need for a process to bond wafers to one another without exposing the wafers to wet environments. The present invention satisfies those needs, as well as others, and overcomes the deficiencies inherent in conventional direct bonding techniques.

BRIEF SUMMARY OF THE INVENTION

The present invention pertains to an apparatus and method for directly bonding materials to one another in a dry environment. The invention bonds materials while inside a plasma environment without breaking vacuum or exposing the materials to external environments. In accordance with an aspect of the invention, materials are bonded inside a plasma chamber, prior to exposure to an external environment; that is, materials are bonded insitu. In accordance with another aspect of the invention, a plasma chamber apparatus is provided which can be used for insitu plasma bonding of materials.

The method and apparatus of the present invention are unique because they provide for a completely dry bonding process. This provides for full strength bonding upon contact in most cases, allowing for heterogeneous materials to be bonded. It eliminates any water or other contamination from adsorbing on the surfaces and becoming trapped at the interface, and thus requiring a high temperature annealing step to remove this interface contamination layer via diffusional processes. Some materials systems may require post bond anneals at low temperatures to fully complete the chemical bond reactions.

The present invention provides for bonding wafers without the need for high temperature anneals or use of organic or inorganic bonding agents. The resulting bonded material is free from macroscopic and microscopic voids, and has a strength equivalent to Si—Si bonded materials which have been bonded with the conventional base bath method and annealed at temperatures greater than 900° C. The bonded materials can be ground and chemically backthinned, and can be used for Bond and Etchback Silicon on Insulator (BESOI), Smart Cut® wafers, high voltage and high current devices, radiation resistant devices, micromachined sensors and actuators, and hybrid semiconductor applications.

An object of the invention is to activate the surfaces of materials for direct bonding in a dry environment.

Another object of the invention is to activate the surfaces of materials for room temperature high strength bonds.

Another object of the invention is to eliminate the need for wet chemical treatments for bonding.

Another object of the invention is to provide for precision alignment of micromachined wafer features.

Another object of the invention is to create hydrophilic surfaces on materials to be bonded.

Another object of the invention is to eliminate contamination problems inherent in bonding in wet environments.

Another object of the invention is to eliminate the high temperature annealing step used in conventional direct bonding which is incompatible with many applications (diffused regions) and many materials (GaAs phase separation).

Another object of the invention is to provide for bonding heterogeneous materials.

Another object of the invention is to provide for direct bonding of similar or dissimilar materials.

Another object of the invention is to provide for integration of electronic circuitry into microsensors.

Another object of the invention is to provide for integration of electronic circuitry into optoelectronic devices.

Another object of the invention is to provide for iterative fabrication of multilayered devices.

Another object of the invention is to provide for direct bonding of semiconductor chips.

Another object of the invention is to provide for direct bonded packaging of semiconductor chips.

Another object of the invention is to provide for bonding of wafers having surfaces which are too rough for bonding with conventional bonding methods.

Another object of the invention is to provide for bonding of wafers after failure of conventional bonding methods.

Another object of the invention is to initially bond materials at room temperature and anneal the bonds at low temperatures.

Another object of the invention is to provide for direct bonding at temperatures of approximately 300° C. or lower.

Another object of the invention is to allow for bond interface chemistry tailoring (e.g. termination species can be changed by specific plasma gas without altering the basic process).

Further objects and advantages of the invention will be brought out in the following portions of the specification, wherein the detailed description is for the purpose of fully disclosing preferred embodiments of the invention without placing limitations thereon.

DESCRIPTION OF THE INVENTION

The ability of materials such as silicon to become bonded without the need for high temperature anneals or use of organic or inorganic bonding agents is based on the model by Stengl. This model states that adsorbed water molecules, which collect on the hydrophilic wafer surfaces after surface activation, form hydrogen bonds between the two wafers. These are the initial contact bonds which holds the material together. Heat causes subsequent chemical reactions to occur which lead to the formation of oxides with strong covalent bonds at the interface. Using wet chemical activation techniques, the kinetics of oxide formation are slow and at room temperature the development of a strong interface is not possible.

On the other hand, plasma surface activation increases the kinetics of the oxide reaction due to the increased mobility of the ionic species created on the surfaces as well as removing adsorbed contamination layers. This has been verified by x-ray photo-spectroscopy (XPS). If hydrogen plasmas are used, the bonding force can be attributed to hydrogen bonding as well as other van der Walls and electrostatic forces. This is similar to hydrophobic bonding with the aqueous HF acid solutions. However, the plasma reduces the possibility for contamination and the need for spin drying as well as increases the electrostatic contribution to the bond force. Theoretically, any surface which can be reduced by a plasma could be activated by this method. By bonding without exposing the surfaces to the environment eliminates contamination from chemical species not in the plasma as well as particulates and reduces the interfacial adsorbed layer. In addition excess moisture is removed from the surfaces during exposure. Excess moisture is well known to lead to microvoid formation.

1. In situ Bonding Apparatus.

A prototype in situ plasma bonding chamber has been constructed that allows for substrate bonding in any plasma at base pressures down to 1.0e-6 Torr. Substrates are placed in the chamber after cleaning and then activated with the appropriate plasma species. The chamber can be backfilled with a new species of gas or evacuated as needed. The variability of these process parameters allows for surface species termination control and reduction of adsorbates and moisture. Bonds with and without interfacial oxide formation have been realized with substantial reductions in bonding temperatures.

Substrate materials are mechanically supported during the plasma exposure to achieve surface activation. The wafers are then released and allowed to fall into alignment and intimate contact. This operation can be done (1) during the plasma exposure, (2) after extinguishing the plasma, or (3) after a backfill gas has been purged into the system. Once the wafers have been released and "mated" a mechanical level is used to initiate the bond wave if the bond wave did not spontaneously initiate when the wafers were released. After bonding in the chamber, the bonded pairs are removed for bond strengthening thermal treatments.

The current system is a manual loading system and the mechanical wafer grip system has not been optimized. It is desirable to have cassette to cassette loading of the two input substrates and output, bonded substrates. This involves implementation of robotic wafer handlers and an automated flat alignment system that is standard on other automated semiconductor equipment. The grip system inside the chamber must not perturb the plasma sheaths nor shadow the plasma from the surface. The current system relies on mechanical flags that are tapered such that isolated point contacts are made to the edge of the wafers only.

The current vacuum system utilizes a turbo pump that is backed by an oil filled mechanical pump. Ideally the mechanical pump would be dry to avoid contamination. We have also found that using a gas purification system and filter will remove residual moisture from the inlet gas stream and particles respectively.

Reactive Ion etchers can be modified to allow in-vacuum mechanical manipulation. It is also possible to use gravity and magnetic manipulation where wafers can be brought into contact without having to physically contact either of the two surfaces.

Ultimately we envision this system as a cluster tool in which the input and output cassette are loadlocked to the bonding system. A robot will retrieve wafers from the input cassette(s) and load them into the plasma chamber with proper alignment. (Note: rotational misalignment of the flats should also be allowed.) Then chamber will then be evacuated and the wafers processed as described above. After bonding the robot will remove the wafers, send to a optional inspection station and then place in the output cassette.

It is also possible to include precision alignment in an IR microscope or fiber optic system to align substrate features relative to one another. In that case, the two substrates are fixed in position with a mechanical apparatus and placed in the plasma. After activation the insitu bonds are made by precision contacting of the surface. A Karl Suss fixture and aligner or the like is suitable for this purpose.

2. In situ Bonding Method.

The method of the present invention generally comprises the following steps. Those skilled in the art will appreciate that the method of the invention can be modified to suit a variety of applications depending on the material used and the interface desired.

(a) For silicon dioxide, silicon, silicon nitride or other materials where an insulating interface is desired, an oxygen plasma can be used effectively according to the following steps:

(i) RCA clean the wafers omitting the HF dip for oxide surfaces;

(ii) Rinse the wafers and dry. Drying can be carried out using spin-rinse-drier, dry nitrogen, or other conventional state of the art drying technique;

(iii) Place the wafers into a plasma chamber equipped with bonding apparatus;

(iv) Expose the wafers to 100 Watt RF oxygen plasma for at least 5 seconds; and (v) Without breaking vacuum, place the wafer surfaces together and contact. Bonding will occur.

(b) For silicon, gallium arsenide, indium phosphide, or other materials where a direct contact without an interface is desired, hydrogen, argon with hydrogen (forming gas), or H/He plasma can be used effectively according to the following steps:

(i) For silicon, RCA clean the wafers utilizing a HF dip or using another conventional state of the art cleaning method;

(ii) (Optional) Rinse the wafers and dry. Drying can be carried out using spin-rinse-drier, dry nitrogen, or other conventional state of the art drying technique;

(iii) Place the wafers into a plasma chamber equipped with bonding apparatus;

(iv) Expose the wafers to 100 Watt RF plasma of the desired gas for at least 5 seconds; and (v) Without breaking vacuum, place the wafer surfaces together and contact. Bonding will occur.

3. Variations on Bonding Method. In situ, plasma wafer bonding can be modified in several ways, including the following:

(a) Changing plasmas, Ar, $NH_4$, $O_2$, $H_2$, H/He, etc. The key feature is using a plasma which reduces the surface species of the candidate material.

(b) Altering exposure times. Care must be taken to limit the exposure time to a minimum such that surface roughening does not occur as well at to prohibit excessively thick interfaces. Surface charge reaches a maximum with less than 10 seconds exposure time.

(c) Altering the power and flow rate of the plasma gasses. Care must be taken to limit surface roughening and contamination. Low power and low flow rates will maintain surface quality.

(d) Location of the wafers in the plasma. Wafers placed in the glow discharge rather than in the sheath obtain less surface damage and improved bond results.

EXAMPLE 1

A plurality of (100) silicon wafers were cleaned with standard RCA processing and rendered hydrophobic via a BOE dip prior to placement in the bonding chamber. The substrates were then exposed to short oxygen plasma treatments (<1 minute) in the in situ plasma bonding apparatus described above. They were inspected with infrared (IR) for voids and blade insertion tests were performed. Annealing was carried out on a hot plate in air at 400° C. for 20 minutes and at 100° C. for 10 minutes. After annealing the razor insertion was again attempted, followed by cleaving attempts.

An IR spectroscopy study on plasma activated bonded wafers was undertaken. The waveguide cell designed for this study is similar to that used by the Feijoo et al., investigation. To investigate the differences between plasma bonding and similar wet chemical bonding, plasma activated externally bonded, in situ plasma bonded and hydrophilic (bases bath activated) samples were bonded and spectra obtained for temperatures up to 300° C. Due to the weaker bond strength of the hydrophilic bonded sample, preparation of the waveguide which entails sawing, grinding, and polishing was not possible unless the sample had been annealed to 200° C. for 2 hours. Therefore spectra for the hydrophilic sample is only available for temperatures above 200° C. Spectra from a hydrophobic bonded sample, annealed to 1100° C. for 2 hours was used as the background reference. The dimensions of the waveguide cell was 53 mm long and 20 mm wide with 45° entrance/exit bevels.

To better understand the role of the oxygen plasma on the wafer surfaces, a mercury probe was used to perform capacitance-voltage measurements on thermally oxidized wafers. The flatband voltage shift was monitored as a function of exposure time, delay time after exposure (storage time), and temperature.

EXAMPLE 2

Bond Strength

Upon removing the bonded samples from the in situ chamber, it was found that the wafers adhered to one another very strongly so that handling of the bonded pair could be carried out easily. IR inspection show virtually no voids. Upon insertion of a razor blade at the edge of the sample, a ½"–1" crack appeared. After removal of the blade, the surfaces rebonded except for voids due to surface damage caused by the razor blade. This indicated a surface energy of 500–1000 ergs/$cm^2$. After heating to 400° C. for 20 minutes, a razor could no longer be inserted between the substrates but rather the wafers broke away with no interface failure. Cleaving attempts of the pair would result in many pieces, however no interfacial failures could be found. All fractures were of the three dimensional type across the interface rather than interface separation. Anneals carried out at 100° C. for 5 minutes produced identical results. It should be impressed that this dramatic bond strength is typical for anneals carried out at very high temperatures, T>800° C.

Bond Mechanisms

We found that the hydrophilic wet chemical activated sample had a much stronger broad FTIR absorption band centered around 3400 $cm^{-1}$ and was slower to disappear than either of the plasma bonded samples. This band is associated with the O—H stretch in water, therefore we conclude that at 200o there are still water molecules at the interface and that the bond strength is limited by this water bonding. By comparison, plasma bonded samples annealed at the same temperature (200° C.) have very little of the broad 3400 cm$^{-1}$ associated with OH inside silica. It is understandable that the in situ sample would have less water at the interface over all temperatures since moisture at this interface was also diminished since the bonding process occurred in vacuum. However, the externally bonded plasma sample initially has much interface water as expected and as seen in the initial bond spectrum. Comparing the hydrophilic sample to this externally bonded sample we find that the water disappears much more rapidly in the external plasma activated sample as well as the in situ sample. We conclude from this that the oxidation kinetics, which consume the interface water, must be much greater in the plasma activated sample than the wet chemically activated sample.

As for the in situ bonded sample, we find very little water initially except for a fairly sharp absorption centered at 3320 cm$^{-1}$ which we tentatively attribute to the OH stretch in water. However this may be a signal from the stretch of NH, 3200–3400 cm$^{-1}$. This suggestion is derived due to the difference in pre-bond treatment between the hydrophilic sample and both plasma bonded samples. Nitrogen can be easily traced to atmospheric contamination in the plasma chamber. It is fairly difficult say for certain what the exact contribution is which makes up this band when one considers the dynamic situation which is occurring on the surfaces of the substrates inside a plasma (charged species, radicals, broken bonds, etc.). In either case the absorption disappears after 200° C. anneal.

Further examination of the band at 3600–3750 cm$^{-1}$ (attributed to OH stretch) reveals an additional difference between atmospheric bonding and in situ plasma activated bonding. Following 300° C. anneal, both wet chemical and ex situ plasma activated samples bonded at atmospheric conditions show a two to four-fold increase in absorption over that of the in situ bonded sample in which the OH band is almost beyond detection. This suggests that the interfacial oxide is fully saturated for the atmospheric bonded samples and further reduction of this OH will be due to reaction/diffusion upon further annealing and is now rate limiting. The in situ sample however shows a steady decrease in this absorption band through the annealing cycles implying that as the water/hydroxyls decompose the interfacial oxide can react and therefore "absorb" this excess and does not rate limit the process.

Reflecting back to the general theories of wafer bonding, it is apparent that this is exactly what is desired. There is no large thermal budget needed to drive off the interfacial water (hydrophilic bonding) or to decompose the hydrogen surface termination in hydrophobic wafer bonding. As long as there is water at the interface of a bonded wafer pair, the bond strength will be limited by the strength of these hydroxyl bonds. The oxidation reaction must continue until the amount of water and hydrogen present at the interface is exhausted, only then does the formation of covalent Si—O—Si bonding strengthen the interface. Also, Si—H and hydroxyl groups on and in silicon oxide are known to be very strongly bonded and not easily removed with low temperatures. Thus the presence of these groups must be reduced through cleaning or vacuum.

For the plasma activated samples some very interesting phenomena occurs in the SiH-stretch regime of the spectra, 2000–2250 cm$^{-1}$. We found that the initial in situ sample had an absorption peak centered at ~2110 cm$^{-1}$ and was skewed slightly towards lower wavenumbers. This broadening we believe is do to the many different variations (surface roughness, dangling bonds, charged species, etc.) in the SiH stretch due to the dynamic conditions in the plasma. Upon annealing "texturing" in the spectra occurs and the spectral height is greatly reduced and separates into several discrete bands centered at 2140, 2100, and 2060 cm$^{-1}$ with a very slight peak at ~2200 cm$^{-1}$. These bands have been assigned by authors as the SiH stretch of SiH3, SiH (Si/SiO$_2$ interface), SiH (across a bonded interface), and O$_2$SiH$_2$ respectively. Upon further annealing the spectra reshapes and forms a very symmetric and smooth peak centered at a slightly higher frequency of 2123 cm$^{-1}$. This corresponds to the highly constrained SiH stretch at the Si/SiO$_x$ interface. For 300° C., we find this peak to shift from 2105 cm$^{-1}$ for the hydrophilic sample, to 2115 cm$^{-1}$ for the plasma activated bonded sample, to the 2123 cm$^{-1}$ as just discussed for the in situ bonded sample. This transition can be associated with the shift of the SiH stretch from 2125 cm$^{-1}$ to 2100 cm$^{-1}$ for SiH at the highly constrained Si/SiO$_x$ interface and Si/SiO$_2$ interface respectively. With this knowledge, we can suggest that this progressive blue shift in the spectra of samples can be attributed to the stoichiometry of the interfacial oxide. The more stoichiometric oxide that appears to form from "wet" or fully hydoxylated surfaces most likely occurs due to oxidation of the interfacial water, forming a more "open" oxide. On the other hand, the in situ bonded sample is akin to a dry oxidation in which very little oxidation occurs. This oxidation process gives rise to strong bonding due to the covalent bonds of Si—O—Si across the interface.

Future work needed to verify these hypotheses requires a detailed study of the SiO absorption regime. The regime of interest is 1000–1200 cm$^{-1}$ and this is very difficult to do with the current MIR-FTIR arrangement. This is due to the bulk absorption of silicon which increases with doping and more importantly due to very strong absorption of the oxygen in the silicon bulk. This was not possible in the current experiment since virtually no signal was detectable below ~1800 cm$^{-1}$.

From the previous discussion we note that not only is there less water at the interface but that the rate of water removal was enhanced for both the in situ and ex situ plasma activated samples. It is well established that low temperature oxidation reactions proceed via electric field driven kinetics, so called Cabrera-Mott oxidation kinetics. We believe the enhanced removal rate of water via oxide formation is directly related to the plasma exposure. Implanted charge, oxide damage, and interface states may all contribute to increasing the oxidation rate. The C-V measurements showed a reproducible, plasma induced, flatband voltage shift. Using a few seconds and up to a few minutes of plasma exposure the flatband voltage would shift dramatically negative. The maximum shift was >10 volts. The shift was accompanied by what is assumed to be an increase in the carrier generation-recombination centers near the interface, since the plots took on a low frequency characteristic shape as opposed to the initial high frequency plot obtained before exposure. We have found that this shift is very stable at room temperature, remaining for several days, and does not diminish with water or isopropynol rinsing. However, with a short, low temperature anneal (200° C., N$_2$, 10 min.), most of the plasma damage is dissipated. This indicates that species are capable of rearrangement at low temperature and therefore partaking in the bonding process, similar to what was found in the FTIR study. These shifts can be used to determine the optimum exposure time for activation of various substrate materials.

Accordingly, we are the inventors of the first, in situ, plasma activated bonded wafers. Wafers bonded while inside a plasma environment for short durations have been shown to be well adhered to one another and obtain very strong bonds at very low annealing temperatures (100° C.). We have examined the role of water at the interface for in situ, ex situ, and conventional chemical activation methods using multiple internal reflection Fourier transform infra red spectroscopy (MIR-FTIR), as a function of annealing temperature. A capacitance-voltage (C-V) study using a non-intrusive mercury probe was also implemented to investigate the effects of plasma on wafer surfaces and to optimize the exposure limits for bonding. It was found that the combination of reduced interface water or hydroxyl species and increased oxidation kinetics can account for the dramatic increases in wafer bonding kinetics.

Bonding wafers inside a plasma environment without exposing the surfaces to water eliminates many of the dissociation and diffusion reactions that are necessary for the interfacial reactions to proceed to completion. The vacuum environment reduces the amount of water that must dissociate and there is significantly less byproduct outgassing that needs to diffuse to a free surface. Surface hydrogen which is present due to contamination in the chamber and what was initially on the wafer is subsequently removed by the oxygen plasma. Oxidation occurs with ions and radicals that were implanted and adsorbed on the surfaces. The C-V study results showed very dramatic electronic changes of the surfaces which may lead to increased oxidation kinetics by enhancing Cabrera-Mott parameters, thereby greatly increasing the rate at which covalent bonding occurs. This study is the first to report on in situ plasma activated wafer bonding. Dramatic increases in the strength of wafers bonded at very low temperatures were reported. The MIR-FTIR and C-V study results can be used to speculate on the role of water during the wafer bonding interface oxidation process and helps to explain the benefits of plasma wafer bonding.

Although the description above contains many specificities, these should not be construed as limiting the scope of the invention but as merely providing illustrations of some of the presently preferred embodiments of this invention. It will be appreciated that the apparatus may vary as to configuration and as to details of the parts and that the method may vary as to the steps and their sequence without departing from the basic concepts as disclosed herein.

What is claimed is:

1. A method for in-situ plasma bonding of semiconductor substrates, comprising:

placing a first substrate and a second substrate into a plasma chamber equipped with a bonding apparatus, the first substrate having a first face and the second substrate having a second face;

maintaining the first substrate and the second substrate in a vacuum in the plasma chamber;

exposing the first face and exposing the second face to a plasma; and placing the first face in contact with the second face to initialize a bond between the first face and the second face without breaking vacuum in the plasma chamber.

2. The method of claim 1 wherein said plasma comprises hydrogen bearing species.

3. The method of claim 1 wherein said plasma comprises an oxygen bearing species.

4. The method of claim 1 wherein said plasma comprises an argon with hydrogen.

5. The method of claim 1 wherein said plasma comprises an NH4 bearing species.

6. The method of claim 1 wherein the first face comprises an insulating material.

7. The method of claim 1 wherein the second face comprises an insulating material.

8. The method of claim 1 further comprising rinsing and drying the first substrate and the second substrate before the placing step.

9. The method of claim 1 wherein the plasma reduces a surface species of the first face and the second face.

10. A method for in-situ plasma bonding of semiconductor substrates, comprising:

placing a first substrate and a second substrate into a plasma chamber, the first substrate having a first face and the second substrate having a second face;

maintaining the first substrate and the second substrate in a vacuum in the plasma chamber;

exposing at least the first face or at least the second face to a plasma;

placing the first face in contact with the second face to initialize a bond between the first face and the second face without breaking vacuum in the plasma chamber; and removing the bonded first substrate and the second substrate from the plasma chamber.

11. The method of claim 10 wherein said plasma comprises hydrogen bearing species.

12. The method of claim 10 wherein said plasma comprises an oxygen bearing species.

13. The method of claim 10 wherein said plasma comprises an argon with hydrogen.

14. The method of claim 10 wherein said plasma comprises an NH4 bearing species.

15. The method of claim 10 wherein the first face comprises an insulating material.

16. The method of claim 10 wherein the second face comprises an insulating material.

17. The method of claim 10 further comprising rinsing and drying the first substrate and the second substrate before the placing step.

18. The method of claim 10 wherein the plasma reduces a surface species of the fist face and the second face.

19. A method for in-situ plasma bonding of semiconductor substrates, comprising:

placing a first substrate and a second substrate into a plasma chamber, the first substrate having a first face and the second substrate having a second face;

maintaining the first substrate and the second substrate in a vacuum in the plasma chamber;

exposing at least the first face or at least the second face to a plasma; and placing the first face in contact with the second face to initialize a bond between the first face and the second face without breaking vacuum in the plasma chamber.

20. The method of claim 19 wherein said plasma comprises hydrogen bearing species.

21. The method of claim 19 wherein said plasma comprises an oxygen bearing species.

22. The method of claim 19 wherein said plasma comprises an argon with hydrogen.

23. The method of claim 19 wherein said plasma comprises an NH4 bearing species.

24. The method of claim 19 wherein the first face comprises an insulating material.

25. The method of claim 19 wherein the second face comprises an insulating material.

26. The method of claim 19 further comprising rinsing and drying the first substrate and the second substrate before the placing step.

27. The method of claim 19 wherein the plasma reduces a surface species of the first face and the second face.

* * * * *